(12) United States Patent
Frohberg et al.

(10) Patent No.: US 7,314,824 B2
(45) Date of Patent: Jan. 1, 2008

(54) NITROGEN-FREE ARC/CAPPING LAYER AND METHOD OF MANUFACTURING THE SAME

(75) Inventors: Kai Frohberg, Meissen (DE); Sven Muehle, Dresden (DE); Hartmut Ruelke, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 361 days.

(21) Appl. No.: 11/112,499

(22) Filed: Apr. 22, 2005

(65) Prior Publication Data

US 2006/0024955 A1 Feb. 2, 2006

(30) Foreign Application Priority Data

Jul. 29, 2004 (DE) .................... 10 2004 036 753

(51) Int. Cl.
*H01L 21/4763* (2006.01)
(52) U.S. Cl. .............. 438/636; 257/E21.039; 257/E21.029; 438/789; 438/677
(58) Field of Classification Search ........ 438/636, 438/677, 633, 789, 644; 257/E21.039, E21.029, 257/E21.035
See application file for complete search history.

(56) References Cited

U.S. PATENT DOCUMENTS

| | | | |
|---|---|---|---|
| 6,316,167 B1 | 11/2001 | Angelopoulos et al. | 430/313 |
| 6,514,667 B2 | 2/2003 | Angelopoulos et al. | 430/271.1 |
| 6,853,043 B2 | 2/2005 | Yeh et al. | 257/437 |
| 2002/0012876 A1 | 1/2002 | Angelopoulos et al. | 438/636 |
| 2002/0155386 A1 | 10/2002 | Xu et al. | 430/312 |
| 2002/0173172 A1* | 11/2002 | Loboda et al. | 438/786 |
| 2004/0087139 A1* | 5/2004 | Yeh et al | 438/636 |
| 2004/0099954 A1* | 5/2004 | Chen et al. | 257/758 |
| 2005/0208755 A1 | 9/2005 | Ruelke et al. | 438/622 |

FOREIGN PATENT DOCUMENTS

WO WO 2004/055881 7/2004

OTHER PUBLICATIONS

Office Action Dated Mar. 21, 2007 from U.S. Appl. No. 11/035,112.

* cited by examiner

*Primary Examiner*—Caridad Everhart
(74) *Attorney, Agent, or Firm*—Williams, Morgan & Amerson, P.C.

(57) ABSTRACT

The present invention provides a nitrogen-free ARC/capping layer in a low-k layer stack, which, in particular embodiments, is comprised of carbon-containing silicon dioxide, wherein the optical characteristics are tuned to conform to the 193 nm lithography. Moreover, the ARC/capping layer is directly formed on the low-k material, thereby also preserving the integrity thereof during an etch and chemical mechanical polishing process.

29 Claims, 6 Drawing Sheets

NITROGEN-FREE ARC/CAPPING LAYER AND METHOD OF MANUFACTURING THE SAME

BACKGROUND OF THE INVENTION

1. Field of the Invention

Generally, the present invention relates to the formation of integrated circuits, and, more particularly, to patterning low-k dielectrics used in metallization layers by means of sophisticated lithography with appropriate ARC layers.

2. Description of the Related Art

In modern integrated circuits, minimum feature sizes, such as the channel length of field effect transistors, have reached the deep sub-micron range, thereby steadily increasing the performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 μm and less, a limiting factor of device performance is the signal propagation delay caused by the switching speed of the transistor elements. As the channel length of these transistor elements is further decreased, and has now even reached 0.05 μm and less, it turns out, however, that the signal propagation delay is no longer limited by the field effect transistors but is limited, owing to the increased circuit density, by the close proximity of the interconnect lines, since the line-to-line capacitance (C) is increased in combination with an increased resistance (R) of the lines due to their reduced cross-sectional area. The parasitic RC time constants therefore require the introduction of a new type of material for forming the metallization layer.

Traditionally, metallization layers are formed in a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper or copper alloys, which have a significantly lower electrical resistance and a higher resistivity against electromigration. For devices having feature sizes of 0.09 μm and less, it turns out that simply replacing aluminum by copper-based metals does not provide the required decrease of the parasitic RC time constants, and therefore the well established and well known dielectric materials silicon dioxide (k≈4.2) and silicon nitride (k>5) are increasingly replaced by so-called low-k dielectric materials having a relative permittivity of less than 3.1. However, the transition from the well-known and well-established aluminum/silicon dioxide metallization layer to a low-k dielectric/copper-based metallization layer is associated with a plurality of problems that need to be addressed.

For example, copper may not be deposited in relatively high amounts in an efficient manner by well-established deposition methods, such as chemical and physical vapor deposition. Moreover, copper may not efficiently be patterned by well-established anisotropic etch processes. Therefore, the so-called damascene technique is frequently employed in forming metallization layers including copper lines. Typically, in the damascene technique, the dielectric layer is deposited and then patterned with trenches and vias that are subsequently filled with copper by plating methods, such as electroplating or electroless plating. Although the damascene technique is presently a well-established technique for forming copper-based metallization layers in standard dielectric materials, such as silicon dioxide, the employment of low-k dielectrics, however, requires the development of new dielectric diffusion barrier layers to avoid copper contamination of adjacent material layers, as copper may readily diffuse in a variety of dielectric materials. Although silicon nitride is known as an effective copper diffusion barrier, silicon nitride may not be considered as an option in low-k dielectric layer stacks owing to its high permittivity. Therefore, presently, silicon carbide is deemed as a viable candidate for a copper diffusion barrier. It turns out, however, that copper's resistance against electromigration strongly depends on the interface between the copper and the adjacent diffusion barrier layer. Therefore, in sophisticated integrated circuits featuring high current densities, it is generally preferable to use up to 20% nitrogen in the silicon carbide layer, thereby remarkably reducing the electromigration of copper as compared to the electromigration that occurs in pure silicon carbide.

A further problem in forming low-k copper-based metallization layers has been under-estimated in the past and is now considered a major challenge in the integration of low-k dielectrics. During the patterning of the low-k dielectric material, advanced photolithography is required to image the structure, including vias and/or trenches, into the photoresist that is sensitive in the deep UV range. In developing the photoresist, certain portions of the resist, which have been exposed, may however not be completely removed as required and thus the structure may then not be correctly transferred into the underlying low-k dielectric material during the subsequent etch process. The effect of insufficiently exposing and developing the photoresist is also referred to as resist poisoning. It is believed that a significant change of the resist sensitivity may be caused by an interaction of nitrogen and nitrogen radicals with the resist layer, thereby locally blocking the photo acidic generator effect during exposure and post-exposure bake of the resist and thus locally modifying the resist structure after resist development (footing). The problem is becoming even more important as the wavelength of the lithography used is reduced as a consequence of more sophisticated process requirements. For instance, currently the patterning of critical features sizes of cutting edge devices may be performed on the basis of a 193 nm (nanometer) light source, requiring appropriately designed photoresists that are highly sensitive in this wavelength range. It turns out, however, that with increased sensitivity at shorter wavelengths, the available photoresists also exhibit an increased sensitivity for resist poisoning mechanisms. Since the introduction of the 90 nm technology may also require a correspondingly advanced lithography in the formation of a metallization layer contacting the circuit elements, increased problems may occur during the patterning of the low-k dielectric as nitrogen and/or compounds may readily be present within the low-k material and other layers in the layer stack, which then may interact with the resist exhibiting the increased sensitivity to resist poisoning. With reference to FIGS. 1a-1c, a typical conventional process flow will now be described to explain the problems involved in patterning a metallization layer by advanced photolithography in more detail.

FIG. 1a schematically shows a cross-sectional view of a typical conventional semi-conductor device 100 in which a low-k dielectric material layer 106 is to be patterned by means of an advanced photolithography in which, for instance, a 193 nm light source is used. The semiconductor device 100 comprises a substrate 101, which may have formed thereon one or more circuit elements that may, in sophisticated devices, have critical dimensions of 0.1 μm and significantly less. For convenience, a corresponding circuit element is not illustrated in FIG. 1a. Formed above the substrate 101 is an interlayer dielectric 102, which may, for instance, be comprised of silicon dioxide, silicon nitride and the like, and which has formed therein a metal-containing region 103 providing electric contact to one or more circuit elements within the substrate 101. The region 103 may be comprised of tungsten, tungsten silicide or any other appropriate contact metal that is well known in the art. An etch stop layer 104, for instance comprised of silicon nitride, silicon carbide, nitrogen-enriched silicon carbide and the like, may be formed on the interlayer dielectric 102. A capping layer 110 comprised of silicon dioxide is formed on the low-k dielectric layer 106, since the low-k material usually suffers from a reduced hardness and stiffness compared to, for instance, silicon dioxide or silicon nitride. Hence, the capping layer 110 is provided to reduce dishing and erosion effects during a chemical mechanical polishing process performed later on for removing excess metal.

An anti-reflective coating (ARC) layer 105 is located on top of the dielectric layer 106, wherein the ARC layer 105 is comprised of silicon oxynitride. Optical characteristics of the ARC layer 105 are tuned in accordance with the requirements of a subsequent photolithography process to be performed to pattern the ARC layer 105 and the underlying capping layer 110 and the dielectric layer 106. For example, the index of refraction in combination with a thickness of the ARC layer 105 is selected with respect to an exposure wavelength of the subsequent photolithography to reduce back-reflection from a bottom surface 107a of a resist layer 107 that is formed on the ARC layer 105, wherein, according to the required optical resolution of the lithography process, the resist layer 107 is selected for a specified exposure wavelength. As previously discussed, for sophisticated applications, the 248 nm lithography is increasingly being replaced by a 193 nm lithography, so that the resist layer 107 exhibits an enhanced sensitivity in this wavelength range, however, at the price of also exhibiting an increased reactivity with nitrogen and nitrogen compounds. The increased reactivity of the resist layer 107 with nitrogen and nitrogen compounds may degrade the formation of an opening 108, indicated by dashed lines, which is to be formed within the resist layer 107 to form a corresponding trench in the ARC layer 105, the capping layer 110 and the dielectric layer 106.

A typical process flow for forming the semiconductor device 100 as shown in FIG. 1a may comprise the following processes. After the formation of any circuit elements in the substrate 101, the metal-containing region 103 embedded into the interlayer dielectric 102 is formed in accordance with well-established manufacturing processes. For instance, depending on the dimensions of the circuit elements, which the metal-containing region 103 is connected to, a correspondingly designed lithography process has to be used, possibly on the basis of a radiation source with a wavelength of 193 nm. Thereafter, the etch stop layer 104 may be deposited by well-established deposition techniques, such as plasma enhanced chemical vapor deposition (PECVD) with a desired thickness and material composition.

Thereafter, the low-k dielectric layer 106 is formed by means of deposition and/or spin-on techniques as are required by the material composition of the dielectric layer 106. For instance, SiCOH is a frequently used material composition for low-k dielectrics, which may, depending on the microstructure of the material, be deposited by various process recipes. In other cases, the dielectric layer 106 may be formed by spin-on techniques when materials of significantly reduced permittivity are required. Thereafter, the capping layer 110 is deposited by PECVD from TEOS or silane. Then, the ARC layer 105 is formed by well-established PECVD techniques wherein process parameters are controlled such that the desired optical behavior of the ARC layer 105 is obtained. That is, during the deposition, the ratio of nitrogen and oxygen in the ARC layer 105 is adjusted to achieve, in combination with a specified layer thickness, a low back-reflection from the surface 107a at the exposure wavelength under consideration. In some conventional approaches, the ARC layer 105 is formed by spin-on techniques with nitrogen-depleted materials, wherein, however, a poor etch selectivity to the layer 106 may result in subsequent etch processes. Next, the resist layer 107 is formed by spin-on techniques including any appropriate pre-exposure processes.

As is evident from the above description, nitrogen is incorporated in a plurality of layers, such as the etch stop layer 104 and in particular the ARC layer 105, and may also be present in varying amounts in the form of nitrogen, nitrogen compounds and nitrogen radicals in the low-k dielectric layer 106, as these materials are typically present in any processes for forming the layers 104 and/or 106 and/or 105. The nitrogen and corresponding compounds may readily diffuse into the resist layer 107 or the nitrogen may come directly into contact with the resist layer 107 as it represents a considerable amount of the stoichiometric composition of the ARC layer 105. Hence, the nitrogen may interact with the resist material, thereby degrading the sensitivity of the resist with respect to an exposure wavelength to be subsequently used. In particular, a resist designed for a 193 nm exposure wavelength readily reacts with nitrogen and its compounds, thereby deteriorating the non-linear behavior of the resist upon exposure. As a consequence, the dimensions of the opening 108 to be formed within the resist layer 107, as indicated by the number 108b, may not be imaged into the resist layer 107 as precisely as is required for a subsequent patterning of the dielectric layer 106.

FIG. 1b schematically shows the semiconductor device 100 after exposure and development of the resist layer 107 to actually form the opening 108 therein. Due to the degraded optical characteristics of the resist layer 107, resist residue 108a may remain after the development of the resist layer 107, thereby affecting the contour and/or the dimensions of the opening 108. Since the resist layer 107 acts as an etch mask in a subsequent anisotropic etch process, the variation of the contour and/or dimension of the opening 108 also negatively affects the etch process, which may finally lead to a metal trench of reduced reliability.

FIG. 1c schematically shows the semiconductor device 100 after completion of the anisotropic etch process for opening the ARC layer 105, the capping layer 110, the dielectric layer 106 and the etch stop layer 104. A trench 109 having a contour and dimension that may significantly deviate from the target dimension, as indicated by the dashed lines 108b, is formed within the dielectric layer 106.

FIG. 1d schematically illustrates the semiconductor device 100 after depositing a barrier layer 112, filling copper 111 into the trench 109 and removing excess material. The above process sequence may be performed by well-established damascene process flows including the sputter deposition of the barrier layer 112 and a seed layer (not shown), followed by an electrochemical deposition of the copper 111. Thereafter, the excess material of the copper 111 and the barrier layer 112 is removed by chemical mechanical polishing (CMP), wherein also the ARC layer 105 is removed. During the CMP process, the capping layer 110 imparts sufficient mechanical stability to the low-k dielectric layer 106 and also acts as a CMP stop layer. Since the width of the trench 109 may be in the range of 0.1 µm and even significantly less for a semiconductor device of a 90 nm technology, the fluctuation in lateral dimension may result in a copper line of reduced reliability, thereby negatively influencing production yield and thus production costs.

In view of the problems identified above, there is a need for an improved technique enabling the patterning of a low-k dielectric layer without undue resist poisoning and adequate mechanical stability for advanced lithography using an exposure wavelengths of, for example, 248 nm and even less.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a substantially nitrogen-free ARC layer to significantly reduce any resist poisoning effects in even highly sensitive photoresists. Moreover, the substantially nitrogen-free ARC layer is provided with a mechanical stability that is sufficient to act as a stabilizing capping layer and CMP stop layer for the low-k dielectric, thereby no longer necessitating a separate capping layer and thus reducing process complexity. In this respect, the term "nitrogen-free" or "substantially nitrogen-free," when used with respect to the material composition of a layer, is meant to describe a layer having a composition represented by stoichiometric formula that does not include nitrogen. It should, however, be borne in mind that minute amounts of nitrogen may still be present within such a substantially nitrogen-free layer owing to a slight contamination with nitrogen caused by process tools and/or diffusion effects. However, these nitrogen impurities do not affect the optical, mechanical, chemical characteristics of the "nitrogen-free" ARC layer. Thus, a layer having a nitrogen content of less than 1 atomic percent or preferably of less than 0.1 atomic percent may be considered as a substantially nitrogen-free layer. The present invention is based on the concept that particularly the ARC layer formed below a resist layer may advantageously be formed of a material without any appreciable amounts of nitrogen and providing similar mechanical characteristics as a conventional silicon dioxide capping layer, wherein, in some embodiments, the ARC/capping layer is formed by a process that does not require any nitrogen as process or carrier gas, thereby reducing the potential of contaminating the substantially nitrogen-free ARC/capping layer.

According to one illustrative embodiment of the present invention, a method comprises forming a low-k dielectric layer above a substrate and forming a substantially nitrogen-free ARC/capping layer with preselected optical characteristics and thickness on the low-k dielectric layer. Furthermore, a resist layer is formed on the substantially nitrogen-free ARC/capping layer and is patterned by a photolithography process, wherein the ARC/capping layer acts as an anti-reflective layer during the photolithography process. A trench is formed in the substantially nitrogen-free ARC/capping layer and the low-k dielectric layer using the patterned resist layer as an etch mask and a conductive material is deposited to fill the trench. Finally, excess conductive material and a portion of the substantially nitrogen-free ARC/capping layer are removed to maintain a minimum layer thickness of the substantially nitrogen-free ARC/capping layer.

In accordance with another illustrative embodiment of the present invention, a method comprises determining a removal rate for a carbon-containing silicon dioxide layer for specified CMP process conditions as used for removing excess copper and barrier material from a low-k dielectric layer. Furthermore, a desired value for a minimum layer thickness of the carbon-containing silicon dioxide layer after the CMP process is determined. Additionally, a minimum initial layer thickness of the carbon-containing silicon dioxide layer is determined on the basis of the removal rate, the specified CMP process conditions and the minimum layer thickness. The method further comprises selecting at least one of a carbon content and a layer thickness to obtain a predefined anti-reflective characteristic of the carbon-containing silicon dioxide layer for a given exposure wavelength, wherein the layer thickness is equal to or higher than the minimum initial layer thickness. A second carbon-containing silicon dioxide layer having the anti-reflective characteristic is formed on the low-k dielectric layer for a plurality of substrates. Finally, a metallization layer is formed on the plurality of substrates using the second carbon-containing silicon dioxide layer as the anti-reflective coating and capping layer for the low-k dielectric layers.

In accordance with a further illustrative embodiment of the present invention, a semi-conductor device comprises a substrate having formed thereon a circuit element and a low-k dielectric layer formed above the circuit element. The device further comprises a metal-filled trench formed in the low-k dielectric layer and a carbon-containing silicon dioxide layer formed on the low-k dielectric layer.

In accordance with still a further illustrative embodiment of the present invention, a semiconductor device comprises a substrate having formed thereon a circuit element and a low-k dielectric layer formed above the circuit element. The device further comprises a metal-filled trench formed in the low-k dielectric layer and an oxygen-containing silicon carbide layer formed on the low-k dielectric layer.

BRIEF DESCRIPTION OF THE DRAWINGS

The invention may be understood by reference to the following description taken in conjunction with the accompanying drawings, in which like reference numerals identify like elements, and in which.

Figure 1A:
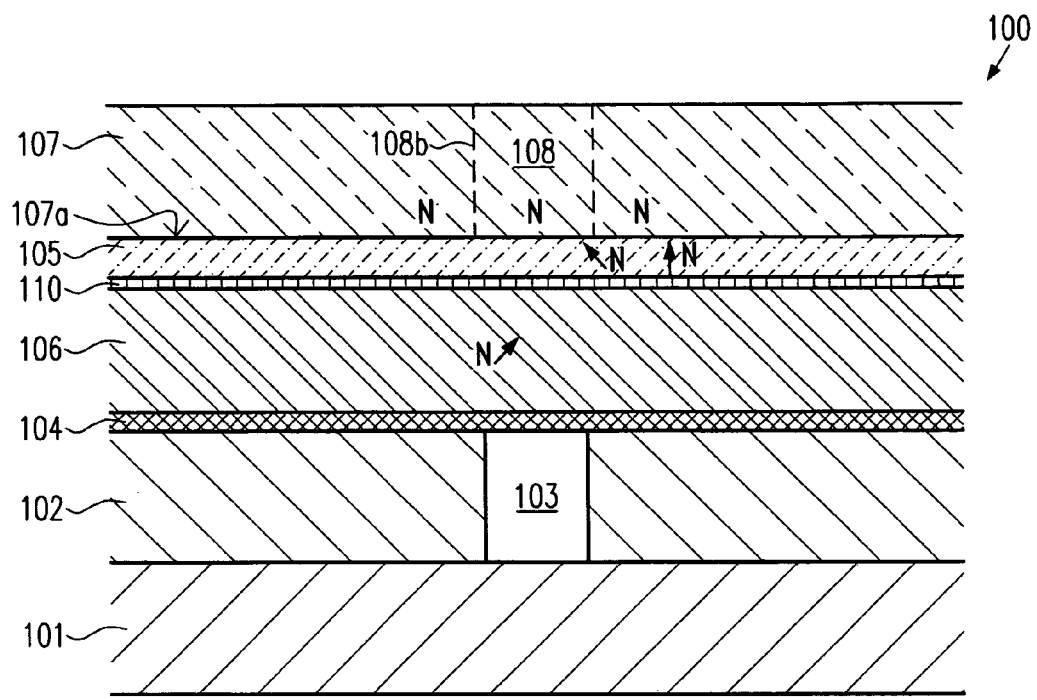
FIGS. 1a-1d schematically show cross-sectional views of a semiconductor device during the patterning of a metallization layer in accordance with conventional process strategies.
Figure 1B:
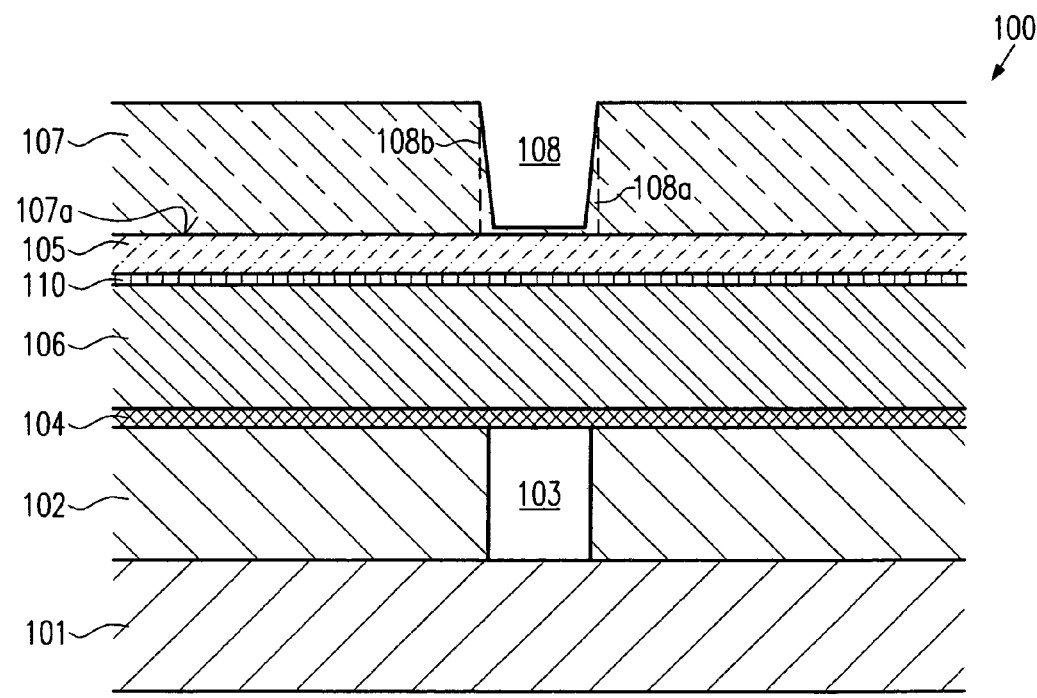
Figure 1C:
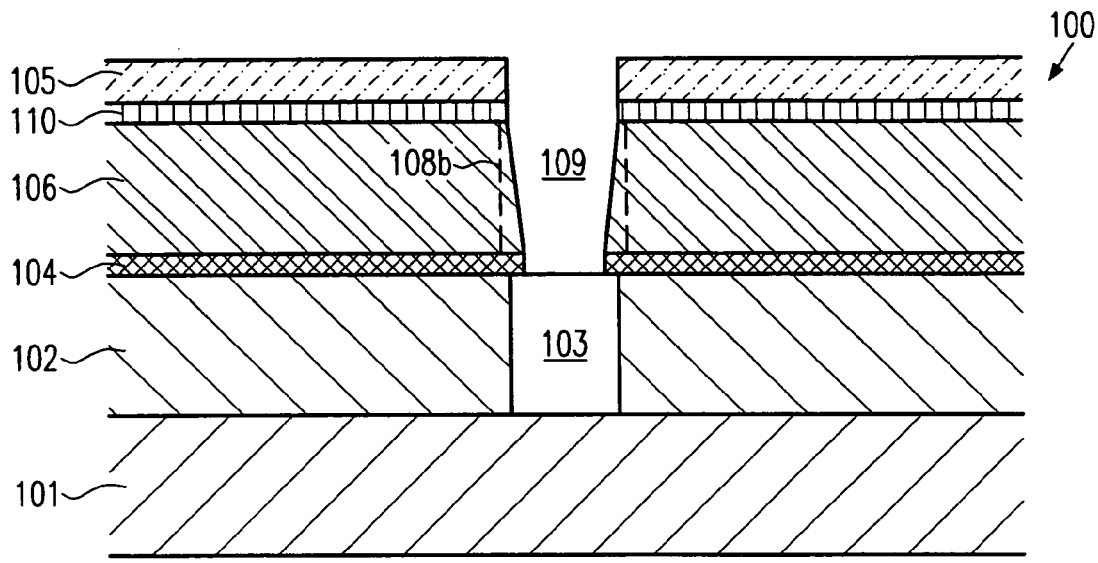
Figure 1D:
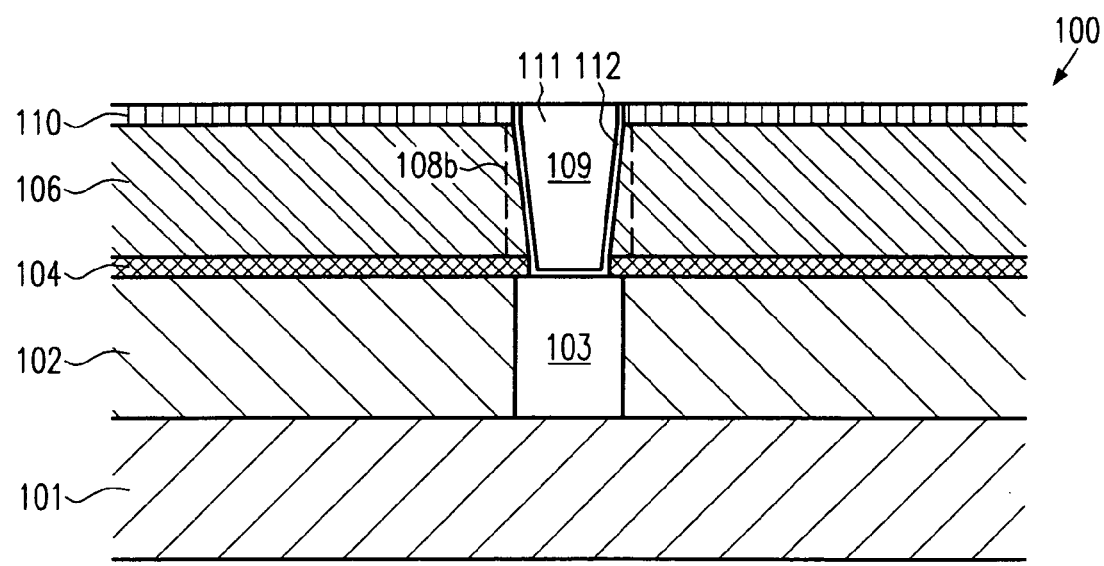

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention provides a technique for significantly reducing the probability of an interaction of nitrogen and nitrogen-containing compounds with a photoresist in advanced lithography techniques requiring the application of an ARC layer formed between the photoresist layer and a material layer to be patterned, while reducing the process complexity by providing an ARC layer that also acts as a capping layer protecting the low-k material during etch and CMP processes. Since the effect of resist poisoning generally influences the formation of circuit features in metallization layers of highly advanced semi-conductor devices, as typically low-k dielectric materials are used here in combination with photoresists that are highly sensitive to nitrogen and nitrogen-containing compounds, the present invention is especially advantageous for patterning low-k dielectric materials in accordance with critical dimensions on the order of 100 nm and less. With reference to FIGS. 2a-2d and 3a-3c, further illustrative embodiments of the present invention will now be described in more detail.

Figure 2A:
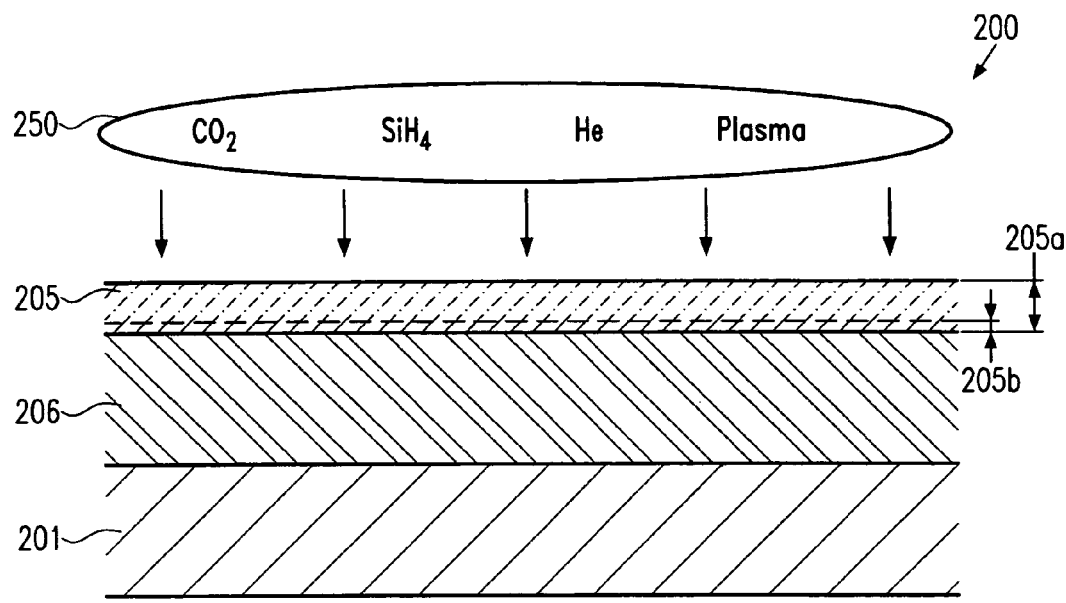
FIGS. 2a-2d schematically show cross-sectional views of a semiconductor device during various manufacturing stages for patterning a metallization layer in accordance with illustrative embodiments of the present invention.

FIG. 2a schematically shows a semiconductor structure 200 comprising a substrate 201, which may include circuit elements, such as transistors, capacitors and the like. So as not to obscure the present invention, such elements are not shown in FIGS. 2a-2c. In other examples, the substrate 201 may represent any substrate for receiving minute structure elements that have to be formed within the substrate 201 or thereon by means of advanced photolithography techniques. In particular embodiments, the substrate 201 may represent a substrate having formed thereon silicon-based circuit elements that have been fabricated by a technology characterized by a technology mode of 90 nm or less.

The semiconductor structure 200 further comprises a low-k dielectric layer 206, which may have a relative permittivity of approximately 3.1 or less and, in a particular embodiment, of approximately 2.8 or less. For instance, the dielectric layer 206 may represent a polymer material having a relative permittivity of less than 3.1. In one particular embodiment, the dielectric layer 206 comprises silicon, carbon, oxygen and hydrogen, represented by the formula SiCOH, with a relative permittivity of 2.8 or less.

An ARC/capping layer 205 is formed on the dielectric layer 206 and may be comprised of silicon dioxide including carbon. The ARC/capping layer 205 represents a substantially nitrogen-free layer in the sense that nitrogen may only be present in the layer 205 in the form of impurities that may have been introduced from the underlying layer 206 or from process tools during the formation of the ARC/capping layer 205. Thus, contrary to the conventional ARC layer 105, in which nitrogen represents an essential component for adjusting the optical characteristics thereof, the ARC/capping layer 205 is characterized by a chemical formula on the basis of silicon, carbon and oxygen, wherein any minute amounts of nitrogen do not determine any optical, mechanical, physical and chemical characteristics of the layer 205. In some embodiments, the ARC/capping layer 205 may also comprise hydrogen in an amount of approximately 5 atomic percent or less. Generally, the mechanical characteristics, that is, hardness and stiffness, are comparable with those of a silicon dioxide layer, such as the layer 110 in FIGS. 1a-1d. A thickness 205a of the ARC/capping layer 205 is selected to provide sufficient CMP stop properties in a CMP process that is later to be performed. In a particular embodiment, the thickness 205a is selected to maintain a minimum thickness 205b after the CMP process. The minimum thickness 205b may be approximately 10 nm or more. Moreover, the thickness 205a is selected in conformity with optical characteristics of the layer 205, such as the index of refraction "n" and the extinction coefficient "k" in order to minimize back-reflection for a specified exposure wavelength, as will be explained in more detail below.

A typical process flow for forming the semiconductor structure 200 as shown in FIG. 2a may comprise the following processes. Depending on the type of substrate and whether there are circuit elements provided thereon or not, a plurality of previous manufacturing processes, possibly on the basis of advanced photolithography techniques, may have been performed. Thereafter, the low-k dielectric layer 206 may be formed above the substrate 201 by any appropriate technique, such as CVD deposition or spin-on methods. Since the low-k dielectric layer 206 is less dense and mechanically stable compared to silicon dioxide, typically a plurality of materials, such as nitrogen, may readily diffuse up to the ARC/capping layer 205, which then may significantly reduce a diffusion through the surface of the layer 206, and may also enhance the mechanical integrity of this layer. Up-diffusion of nitrogen does not substantially impact the nitrogen-free layer 105.

Thereafter, the semiconductor structure 200 may in one embodiment be exposed to a deposition atmosphere 250, which may be established in any appropriate deposition tool that is equipped to also provide a plasma within the deposition atmosphere 250. Corresponding PECVD deposition tools are readily available and may be effectively used with the present invention. In one particular embodiment, a PECVD deposition tool from Applied Materials, available under the name Producer™, may be advantageously used. As previously discussed, for obtaining a low nitrogen impurity rate in the layer 205, a corresponding process tool for establishing the deposition atmosphere 250 may correspondingly be cleaned by using process gases other than nitrogen-containing precursors and carrier gases. After a corresponding cleaning process or by using a process tool dedicated to nitrogen-free processes, in one particular embodiment, the deposition atmosphere 250 is created on the basis of carbon dioxide ($CO_2$) or carbon monoxide (CO) and silane ($SiH_4$) precursors. In some embodiments, it is advantageous to use helium as a carrier gas, while, in other embodiments, other gases, such as argon, may be used. A plasma may be excited in the deposition atmosphere 250 by supplying high frequency power, wherein, depending on the chamber geometry of the process tool used, the power of the high frequency, as well as a distance of the deposition atmosphere 250 from the substrate 201, may be selected to obtain the required deposition rate. For instance, for the above-identified Producer™ system, the high frequency power may be adjusted to approximately 70-110 Watts with a spacing of a corresponding shower head to the substrate 201 in the range of approximately 450-550 mils. A pressure within the deposition atmosphere 250 may, in one embodiment, be adjusted to the range of approximately 5.5-6.8 Torr or, in other embodiments, to approximately 6.3±0.5 Torr.

With the above-specified parameters, the thickness 205a of the ARC/capping layer 205 may be varied within a wide range of approximately 40-170 nm and, in particular embodiments, in the range of approximately 50-150 nm, wherein the thickness is advantageously controlled by the deposition time. Based on the above parameters, a deposition rate of approximately 100-140 nm per minute may be achieved. In one illustrative embodiment, the across-substrate non-uniformity of the ARC layer 205 may be maintained at 1.5% or less.

For the above-specified parameters, the ARC layer 205 may have a thickness of approximately 60-120 nm, with an across-substrate non-uniformity of less than approximately 1.5%, achieved by a deposition rate of approximately 120±12 nm/minute. The index of refraction is approximately 1.92±0.3, while the extinction coefficient is approximately 0.65±0.3 at 193 nm wavelength. It should be noted that the characteristics determining the optical behavior of the ARC/capping layer 205, that is the thickness 205a, the index of refraction and the extinction coefficient, may be varied by correspondingly controlling the deposition parameters. For instance, the ratio of silicon and carbon dioxide may be varied within a range of approximately 0.012-0.02 to adjust the index of refraction to a desired target value. However, other parameters, such as temperature and pressure, may be correspondingly adjusted to obtain the desired target value. One or more target values for one or more optical characteristics of the ARC layer 205 may be determined in advance on the basis of a desired initial thickness 205a, as will be described in more detail with reference to FIGS. 3a-3c.

In other embodiments, the ARC/capping layer 205 may be formed by PECVD on the basis of TEOS, oxygen and/or ozone and carbon dioxide or carbon monoxide. For instance, well-established recipes for the deposition of silicon dioxide may be modified to provide carbon oxide in the deposition atmosphere to adjust the carbon concentration in the layer 205. Similarly, other process parameters, such as plasma power, temperature, pressure and the like may be varied and the correspondingly obtained test layers may be estimated with respect to their optical properties to correlate a specific process recipe with the optical behavior of the layer 205. From these results, the appropriate thickness 205a may be selected for a given index of refraction and extinction coefficient, which are correlated to a specific process recipe.

In some embodiments, the concentration of carbon within the layer 205 may vary along the thickness 205a to vary the optical and/or mechanical characteristics in a gradual or step-wise manner. For example, the deposition process may be performed to start with a substantially low carbon concentration, that is, a silicon dioxide layer, and increase the carbon concentration. Likewise, a substantially "pure" silicon carbide layer may initially be deposited with an increasing amount of oxygen to adjust the optical and/or mechanical characteristics. A plurality of different process recipes for forming the ARC/capping layer 205 may be correlated with respective optical characteristics, that is, the index of refraction and the extinction coefficient by performing a plurality of test runs with varied process conditions and subsequent measurements.

Figure 2B:
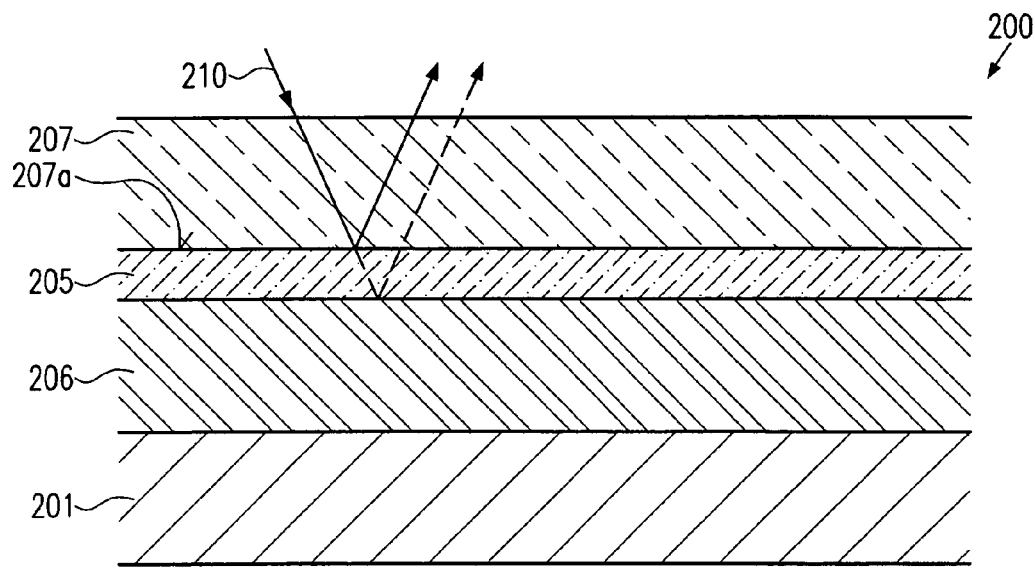

FIG. 2b schematically shows the semiconductor structure 200 with a resist layer 207 formed on the ARC/capping layer 205. In embodiments relating to highly sophisticated semiconductor devices, the resist layer 207 may represent a photoresist designed for a 193 nm exposure wavelength. In one particular embodiment, the optical characteristics and the thickness 205a of the ARC/capping layer 205 are selected to maintain a back-reflection of exposure radiation 210 from a bottom surface 207a of the resist layer 207 at approximately 3% and less. Moreover, the extinction coefficient and the layer thickness 205a may be selected such that an influence of thickness variations of the dielectric layer 206 on the lithography using the exposure radiation 210 may be significantly reduced. That is, the optical characteristics of the ARC/capping layer 205 are adjusted to maintain the back-reflection below a specified level, for instance approximately 3%, even if the thickness of the layer 206 varies, thereby effectively optically "decoupling" the resist layer 207 and the ARC/capping layer 205 from any underlying material layers. It is to be noted that reducing the thickness 205a of the ARC/capping layer 205 may result in a reduced reflectivity but may not provide the desired degree of decoupling. The increased optical decoupling may be achieved by selecting the extinction coefficient and the layer thickness 205a of the ARC/capping layer 205 to be moderately high, as will also be explained with reference to FIGS. 3a-3c.

Figure 2C:
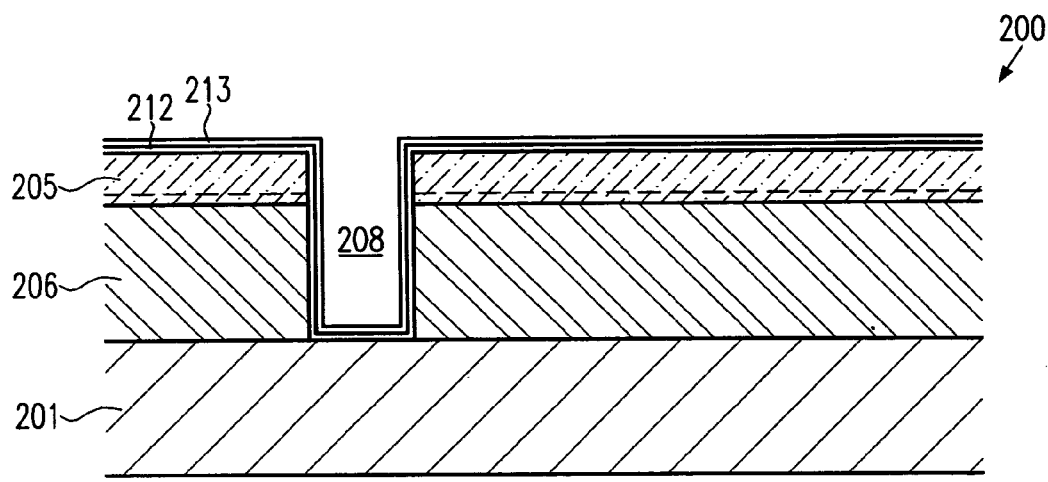

FIG. 2c schematically shows the semiconductor structure 200 in a further advanced manufacturing stage. An opening or trench 208 is formed in the ARC/capping layer 205 and the low-k dielectric layer 206 with a barrier layer 212 and a seed layer 213 formed on the layer 205 and within the trench 208.

The semiconductor structure 200 as shown in FIG. 2c may be formed by the following processes. Based on the superior characteristics of the ARC/capping layer 205 acting as an ARC layer and a highly selective etch mask, the resist layer 207 may be patterned and the corresponding resist mask may be used for forming the opening or trench 208 in accordance with process specifications, wherein the effect of resist poisoning may be significantly reduced. During a corresponding etch process for forming the opening 208, the ARC/capping layer 205 may serve as an etch mask after the resist may have been "consumed" by the etch process, wherein the ARC/capping layer 205 also provides increased etch selectivity compared to nitrogen-depleted conventional ARC layers formed by spin-on techniques. Thereafter, the barrier layer 212 and the seed layer 213 may be formed by well-established sputter deposition techniques or other processes, such as atomic layer deposition (ALD), electrochemical deposition and the like. Subsequently, copper or a copper-based metal may be deposited to fill the trench 208.

Figure 2D:
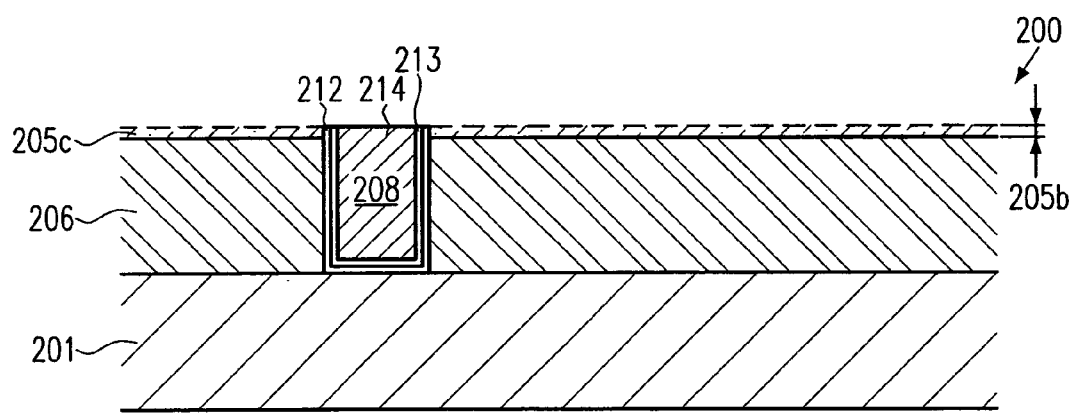

FIG. 2d schematically shows the semiconductor structure 200 with the trench 208 filled with a metal, such as copper 214. Moreover, the ARC/capping layer 205 is now reduced to the thickness 205b and is indicated as layer 205c. The copper 214 may be deposited by electroplating or electroless plating and the excess metal or portions thereof may be removed by CMP, thereby also removing the layers 212 and 213 on exposed surface portions. Due to the selection of the initial thickness 205a to provide at least the minimum thickness 205b at the end of the CMP process, the layers 212 and 213 may reliably be removed without compromising the integrity of the low-k dielectric layer 206. For this purpose, the removal rate for a specific CMP recipe to be used may be established for a plurality of different test layers 205. From these removal rates, a "save" layer thickness 205a may be determined to arrive at the minimum thickness 205b for a given CMP process time that is considered necessary once the layer 213 begins to be exposed during the CMP process. During the determination of the save thickness 205a, the possible material removal of the layer 205 during the process for etching through the layer 206 after the resist mask is consumed may also be taken into consideration. Based on the determined save thickness 205a, a corresponding process recipe, i.e., corresponding optical characteristics of the layer 205, may be determined on the basis of simulations and the results of test measurements with respect to the correlation of optical characteristics and deposition parameters, as is previously discussed.

Thus, based on the thickness 205a, the optical characteristics of the ARC/capping layer 205 may be selected in advance for a desired optical behavior during a sophisticated photolithography process so that corresponding process parameters, i.e., an appropriate process recipe, for forming the layer 205 may correspondingly be determined.

Figure 3A:
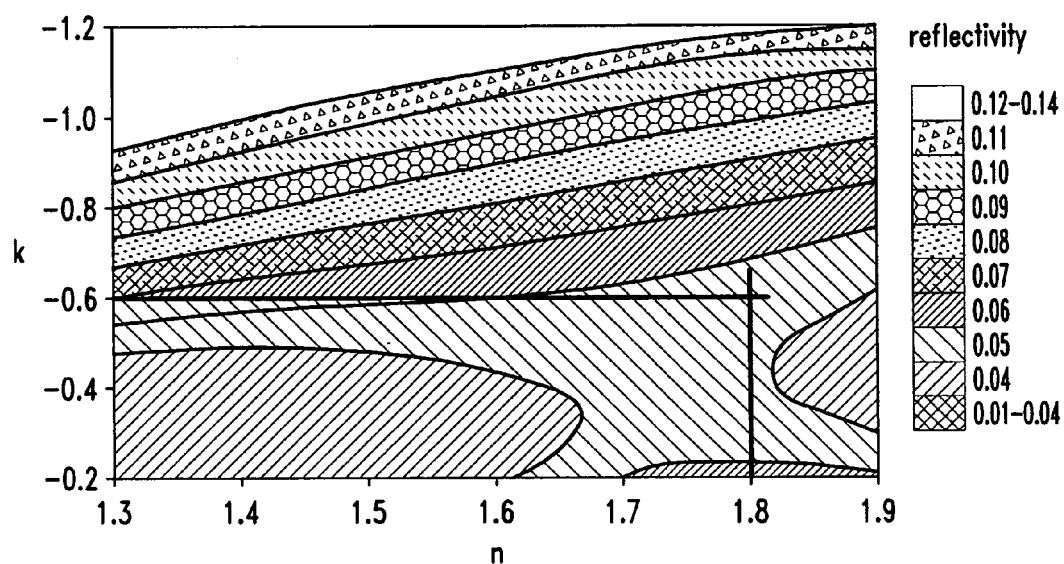
FIGS. 3a-3c schematically show graphs representing results of simulation calculations to establish appropriate target values for a process recipe to form a nitrogen-free ARC layer in accordance with illustrative embodiments of the present invention.

FIG. 3a represents a graph depicting the relationship between the extinction coefficient "k" (vertical axis) and the index of refraction "n" (horizontal axis) for a varying degree of reflection "R" (gray scales) from the bottom surface 207a of the resist layer 207. The results shown are based on a corresponding simulation calculation. The calculations are based on a value of 45 nm for the thickness 205a of the ARC/capping layer 205. A relatively high value for the extinction coefficient is selected to decouple the optical behavior of the ARC layer 205 and the resist layer 207 from the underlying substrate. However, as is indicated, for a value of 0.6 for the extinction coefficient, the reflectivity is still approximately 5%.

Figure 3B:
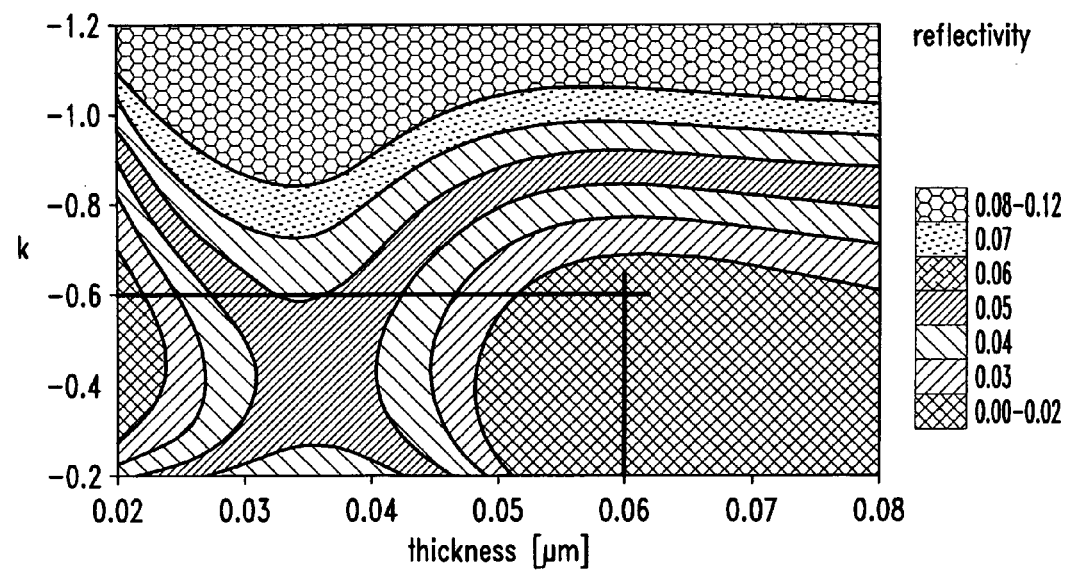

FIG. 3b schematically shows the dependency of the extinction coefficient "k" (vertical axis) from the layer thickness (horizontal axis) on the basis of the intensity reflected from the resist bottom surface 207a (gray scales). As is indicated by FIG. 3b, increasing the layer thickness to approximately 60 nm may lead to a reduced reflectivity of approximately 3% at a desirably high extinction coefficient of approximately 0.6.

It is now assumed that, for a specified process flow, the save thickness 205a has been determined to be approximately 45 nm so that a higher value, such as 60 nm, will reliably provide sufficient tolerance. However, a similar procedure may be performed for other values of the thickness 205a.

Figure 3C:
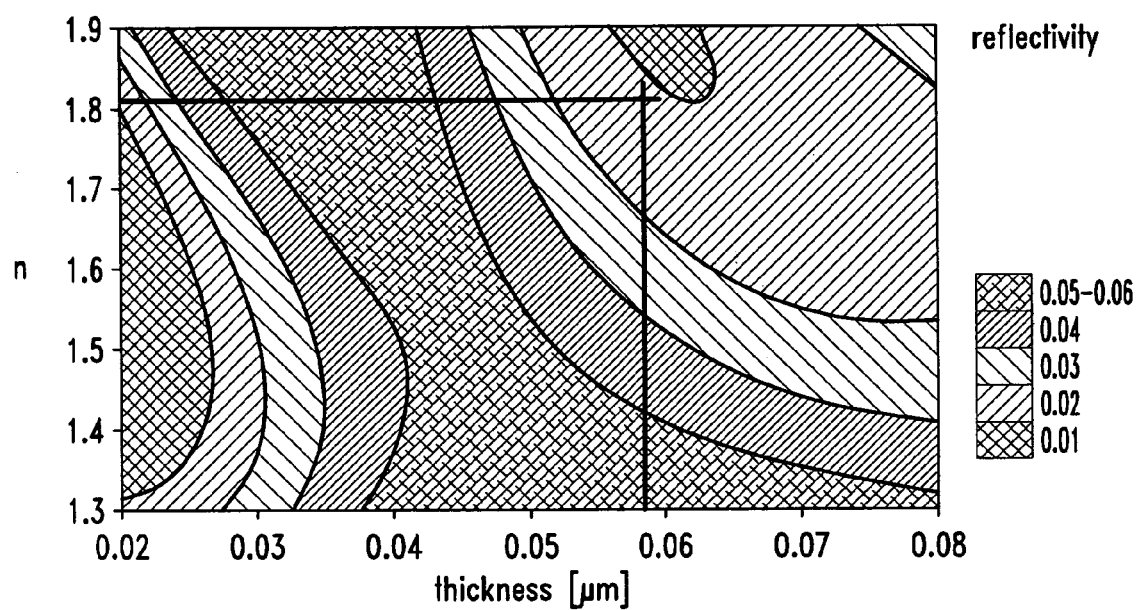

FIG. 3c shows a graph depicting the dependency of the index of refraction "n" (vertical axis) with respect to the layer thickness (horizontal axis) and the resulting reflected intensity (gray scales). As may be seen, an index of refraction of approximately 1.8 may be selected at the layer thickness of approximately 60 nm to obtain a reflectivity of approximately 2-3%. Thus, target values for the index of refraction, the extinction coefficient and the layer thickness of approximately 1.8, 0.6 and 60 nm, respectively, may be selected for a lithography process based on a 193 nm exposure wavelength.

Since corresponding process conditions for forming the layer 205 having the target values 1.8 and 0.6 for the index of refraction and the extinction coefficient, respectively, may have been identified previously, an appropriate deposition time may be selected to obtain the desired thickness 205a. Once the process conditions for forming the layer 205 are determined, this process may be applied to a plurality of product substrates.

It should be appreciated that the above calculations may also be performed for a layer 205 having optical characteristics that vary along the thickness 205a.

As a result, the present invention provides an improved technique for a substantially nitrogen-free ARC/capping layer that is particularly advantageous in combination with a 193 nm lithography. In addition to a significantly reduced poisoning effect, the substantially nitrogen-free ARC layer also exhibits an improved etch selectivity with respect to an underlying dielectric material compared to spin-on ARC layers, as are frequently used in conventional processes. Moreover, the technique described here provides a high degree of flexibility in adapting the mechanical characteristics of the substantially nitrogen-free ARC/capping layer to CMP, etch and other process requirements, while maintaining production costs at a low level. In particular, a single deposition process may be sufficient to provide anti-reflective characteristics and ensure the mechanical integrity of the low-k material during CMP. Advantageously, the ARC/capping layer is comprised of silicon, oxygen and carbon, wherein the mechanical characteristics may be those of a silicon dioxide layer or a silicon carbide layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a low-k dielectric layer above a substrate;
   forming a substantially nitrogen-free ARC/capping layer with preselected optical characteristics and thickness on said low-k dielectric layer, wherein forming said substantially nitrogen-free ARC/capping layer comprises controlling at least one process parameter to obtain at least one layer characteristic that varies along the thickness of the substantially nitrogen-free ARC/capping layer;

forming a resist layer on said substantially nitrogen-free ARC/capping layer;

patterning said resist layer by a photolithography process, said ARC/capping layer acting as an anti-reflective layer during said photolithography process;

forming a trench in said substantially nitrogen-free ARC/capping layer and said low-k dielectric layer using said patterned resist layer as an etch mask;

depositing a conductive material to fill said trench; and removing excess conductive material and a portion of said substantially nitrogen-free ARC/capping layer to maintain a minimum layer thickness of said substantially nitrogen-free ARC/capping layer.

2. The method of claim 1, wherein said substantially nitrogen-free ARC/capping layer comprises carbon, whose concentration varies along the thickness of the substantially nitrogen-free ARC/capping layer.

3. The method of claim 1, wherein a relative permittivity of said low-k dielectric layer is approximately 2.8 or less.

4. The method of claim 1, wherein said substantially nitrogen-free ARC/capping layer is comprised of carbon-containing silicon dioxide.

5. The method of claim 4, wherein said substantially nitrogen-free ARC/capping layer is formed by plasma enhanced chemical vapor deposition on the basis of carbon oxide, silane and a noble gas.

6. The method of claim 4, wherein said substantially nitrogen-free ARC/capping layer is formed by plasma enhanced chemical vapor deposition on the basis of TEOS, oxygen and carbon oxide.

7. The method of claim 1, further comprising determining said preselected optical characteristics and thickness for a given desired value of said minimum layer thickness.

8. The method of claim 7, wherein said minimum layer thickness is at least approximately 10 nm.

9. The method of claim 7, wherein said optical characteristics and thickness are determined for an exposure wavelength of approximately 193 nm.

10. A method, comprising:

determining a removal rate for a carbon-containing silicon dioxide layer for specified chemical mechanical polishing process conditions as used for removing excess copper and barrier material from a low-k dielectric layer;

determining a desired value for a minimum layer thickness of said carbon-containing silicon dioxide layer after said chemical mechanical polishing process;

determining a minimum initial layer thickness of said carbon-containing silicon dioxide layer on the basis of said removal rate, the specified chemical mechanical polishing process conditions and said minimum layer thickness;

selecting at least one of a carbon content and a layer thickness to obtain a predefined anti-reflective characteristic of said carbon-containing silicon dioxide layer for a given exposure wavelength, said layer thickness being equal to or higher than said minimum initial layer thickness;

forming a second carbon-containing silicon dioxide layer having said anti-reflective characteristic on said low-k dielectric layer formed on a plurality of substrates; and forming a metallization layer on said plurality of substrates using said second carbon-containing silicon dioxide layer as anti-reflective coating and capping layer for said low-k dielectric layers.

11. The method of claim 10, wherein said minimum initial layer thickness is approximately 60 nm or more.

12. The method of claim 10, wherein said carbon-containing silicon dioxide layer is formed by plasma enhanced chemical vapor deposition on the basis of carbon oxide, silane and a noble gas.

13. The method of claim 10, wherein said carbon-containing silicon dioxide layer is formed by plasma enhanced chemical vapor deposition on the basis of TEOS, oxygen and carbon oxide.

14. The method of claim 10, wherein forming said carbon-containing silicon dioxide layer comprises controlling at least one process parameter to obtain at least one layer characteristic that varies along the thickness of the carbon-containing silicon dioxide layer.

15. The method of claim 10, further comprising determining an etch rate for said carbon-containing silicon dioxide layer for specified etch process conditions as used for forming a trench in said low-k dielectric layer, and determining said minimum initial layer thickness on the basis of said etch rate.

16. A semiconductor device, comprising:

a substrate having formed thereon a circuit element;

a low-k dielectric layer formed above said circuit element;

a metal-filled trench formed in said low-k dielectric layer, wherein a width of said trench is approximately 90 nm or less; and a carbon-containing silicon dioxide layer formed on said low-k dielectric layer.

17. The semiconductor device of claim 16, wherein said low-k dielectric layer, said carbon-containing silicon dioxide layer and said metal-filled trench represent a portion of a copper-based metallization layer of an integrated circuit.

18. The semiconductor device of claim 16, wherein said low-k dielectric layer has a relative permittivity of approximately 3.1 or less.

19. The semiconductor device of claim 16, wherein said carbon-containing silicon dioxide layer is substantially nitrogen free.

20. The semiconductor device of claim 16, wherein a concentration of carbon in said carbon-containing silicon dioxide layer varies along a thickness of said carbon-containing silicon dioxide layer.

21. A semiconductor device, comprising:

a substrate having formed thereon a circuit element;

a low-k dielectric layer formed above said circuit element;

a metal-filled trench formed in said low-k dielectric layer, wherein a width of said trench is approximately 90 nm or less; and an oxygen-containing silicon carbide layer formed on said low-k dielectric layer.

22. The semiconductor device of claim 21, wherein said low-k dielectric layer, said oxygen-containing silicon carbide layer and said metal-filled trench represent a portion of a copper-based metallization layer of an integrated circuit.

23. The semiconductor device of claim 21, wherein said low-k dielectric layer has a relative permittivity of approximately 3.1 or less.

24. The semiconductor device of claim 21, wherein said oxygen-containing silicon dioxide layer is substantially nitrogen free.

25. A method, comprising:

forming a low-k dielectric layer above a substrate;

forming a substantially nitrogen-free ARC/capping layer with preselected optical characteristics and thickness on said low-k dielectric layer, wherein said substantially nitrogen-free ARC/capping layer is formed by plasma enhanced chemical vapor deposition on the basis of TEOS, oxygen and carbon oxide;

forming a resist layer on said substantially nitrogen-free ARC/capping layer;

patterning said resist layer by a photolithography process, said ARC/capping layer acting as an anti-reflective layer during said photolithography process;

forming a trench in said substantially nitrogen-free ARC/capping layer and said low-k dielectric layer using said patterned resist layer as an etch mask;

depositing a conductive material to fill said trench; and removing excess conductive material and a portion of said substantially nitrogen-free ARC/capping layer to maintain a minimum layer thickness of said substantially nitrogen-free ARC/capping layer.

26. The method of claim 25, wherein a relative permittivity of said low-k dielectric layer is approximately 2.8 or less.

27. The method of claim 25, further comprising determining said preselected optical characteristics and thickness for a given desired value of said minimum layer thickness.

28. The method of claim 27, wherein said minimum layer thickness is at least approximately 10 nm.

29. The method of claim 27, wherein said optical characteristics and thickness are determined for an exposure wavelength of approximately 193 nm.

* * * * *